(12) United States Patent
Scholz et al.

(10) Patent No.: US 8,987,921 B2
(45) Date of Patent: Mar. 24, 2015

(54) MULTIFUNCTION SENSOR AS POP MICROWAVE PCB

(75) Inventors: Ulrike Scholz, Korntal (DE); Ralf Reichenbach, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/825,436

(22) PCT Filed: Jul. 29, 2011

(86) PCT No.: PCT/EP2011/063070
§ 371 (c)(1),
(2), (4) Date: Jun. 10, 2013

(87) PCT Pub. No.: WO2012/038127
PCT Pub. Date: Mar. 29, 2012

(65) Prior Publication Data
US 2013/0256919 A1 Oct. 3, 2013

(30) Foreign Application Priority Data

Sep. 21, 2010 (DE) .......................... 10 2010 041 129

(51) Int. Cl.
*B81B 7/00* (2006.01)
*B81C 1/00* (2006.01)
(Continued)

(52) U.S. Cl.
CPC ............ *B81B 7/0006* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 7,615,411 B2 * 11/2009 Jobetto .......................... 438/109
2001/0010627 A1 * 8/2001 Akagawa ...................... 361/761
(Continued)

FOREIGN PATENT DOCUMENTS

| CN | 1744313 A | 3/2006 |
| DE | 102 50 621 A1 | 5/2004 |

(Continued)

OTHER PUBLICATIONS

The Next Step in Assembly and Packaging: System Level Integration in the package (SiP). International Technology Roadmap for Semiconductors 2007.*
(Continued)

*Primary Examiner* — Joseph Schoenholtz
(74) *Attorney, Agent, or Firm* — Maginot, Moore & Beck LLP

(57) ABSTRACT

A method for producing a component with at least one microstructured or nano-structured element includes applying at least one micro-structured or nano-structured element to a carrier. The element has at least one area configure to make contact and the element is applied to the carrier such that the at least one area adjoins the carrier. The element is enveloped in an enveloping compound and the element-enveloping compound composite is detached from the carrier. A first layer comprising electrically conductive areas is applied to the side of the element-enveloping compound composite that previously adjoined the carrier. At least one passage is introduced into the enveloping compound. A conductor layer is applied to the surface of the passage and at least to a section of the layer comprising the first electrically conductive areas to generate a through contact, which enables space-saving contacting. A component is formed from the method.

18 Claims, 5 Drawing Sheets

(51) Int. Cl.
*H01L 23/28* (2006.01)
*H01L 23/522* (2006.01)
*H01L 23/528* (2006.01)
*H01L 21/56* (2006.01)
*H01L 23/31* (2006.01)
*H01L 23/00* (2006.01)
*H01L 25/065* (2006.01)
*H01L 25/10* (2006.01)
*H01L 25/16* (2006.01)
*H01L 25/00* (2006.01)

(52) U.S. Cl.
CPC ............ *H01L23/3121* (2013.01); *H01L 24/19* (2013.01); *H01L 24/20* (2013.01); *H01L 24/24* (2013.01); *H01L 24/82* (2013.01); *H01L 25/0652* (2013.01); *H01L 25/0655* (2013.01); *H01L 25/0657* (2013.01); *H01L 25/105* (2013.01); *H01L 25/16* (2013.01); *H01L 25/50* (2013.01); *B81B 7/0074* (2013.01); *B81C 1/00333* (2013.01); *H01L 24/04* (2013.01); *H01L 24/06* (2013.01); *H01L 24/12* (2013.01); *H01L 24/32* (2013.01); *H01L 24/48* (2013.01); *H01L 24/73* (2013.01); *H01L 24/97* (2013.01); *H01L 2224/04105* (2013.01); *H01L 2224/06181* (2013.01); *H01L 2224/12105* (2013.01); *H01L 2224/24137* (2013.01); *H01L 2224/32145* (2013.01); *H01L 2224/32225* (2013.01); *H01L 2224/48137* (2013.01); *H01L 2224/48225* (2013.01); *H01L 2224/73265* (2013.01); *H01L 2224/97* (2013.01); *H01L 2225/0651* (2013.01); *H01L 2225/06517* (2013.01); *H01L 2225/06524* (2013.01); *H01L 2225/06541* (2013.01); *H01L 2225/06551* (2013.01); *H01L 2225/06582* (2013.01); *H01L 2225/1035* (2013.01); *H01L 2225/1058* (2013.01); *H01L 2924/01013* (2013.01); *H01L 2924/01029* (2013.01); *H01L 2924/01047* (2013.01); *H01L 2924/01058* (2013.01); *H01L 2924/01079* (2013.01); *H01L 2924/01082* (2013.01); *H01L 2924/15311* (2013.01); *H01L 2924/01005* (2013.01); *H01L 2924/01019* (2013.01); *H01L 2924/01024* (2013.01); *H01L 2924/01033* (2013.01); *H01L 2924/01078* (2013.01); *H01L 2224/48227* (2013.01)

USPC ............ 257/787; 257/788; 257/E23.116; 257/E23.011; 257/E23.114; 257/E23.01; 438/113; 438/126; 438/127

(56) References Cited

U.S. PATENT DOCUMENTS

| | | | |
|---|---|---|---|
| 2004/0110323 A1 | 6/2004 | Becker et al. | |
| 2008/0044944 A1* | 2/2008 | Wakisaka et al. | 438/106 |
| 2008/0272465 A1* | 11/2008 | Do et al. | 257/620 |
| 2008/0272470 A1 | 11/2008 | Do et al. | |
| 2009/0039523 A1 | 2/2009 | Jiang et al. | |
| 2009/0140394 A1* | 6/2009 | Bathan et al. | 257/621 |
| 2009/0243045 A1* | 10/2009 | Pagaila et al. | 257/621 |
| 2010/0019370 A1 | 1/2010 | Pressel et al. | |
| 2010/0078772 A1* | 4/2010 | Robinson | 257/621 |
| 2011/0037169 A1* | 2/2011 | Pagaila | 257/737 |

FOREIGN PATENT DOCUMENTS

| | | |
|---|---|---|
| DE | 10 2004 041 889 A1 | 3/2006 |
| DE | 10 2006 001 429 A1 | 3/2007 |
| JP | 2009-260165 A | 11/2009 |

OTHER PUBLICATIONS

Definition of 'envelop' downloaded from URL<http://www.merriam-webster.com/dictionary/enveloping> on Apr. 9, 2014.*
Definition of 'adjoin' downloaded from URL<http://www.merriam-webster.com/dictionary/adjoin> on Apr. 9, 2014.*
Definition of 'ply' downloaded from URL <http://www.merriam-webster.com/dictionary/ply> on Apr. 9, 2014.*
Ching-Kuan Lee, et. al., "Investigation of the process for glass interposer," Microsystems, Packaging, Assembly and Circuits Technology Conference (IMPACT), 2013 8th International , pp. 194,197, Oct. 22-25, 2013.*
Epoxy Molding Compounds downloaded from URL<http://www.hitachi-chem.co.jp/english/products/srm/011.html> on Jul. 15, 2014.*
Coefficient of Thermal Expansion downlaed from URL <http://www.ami.ac.uk/courses/topics/0197_cte/> on Jul. 15, 2014.*
Fabrication: Mold-First and RDL First Approach for High Density FO WLP, Institute of Microelectronics Apr. 22, 2014.*
International Search Report corresponding to PCT Application No. PCT/EP2011/063070, mailed Nov. 23, 2011 (German and English language document) (7 pages).

* cited by examiner

US 8,987,921 B2

MULTIFUNCTION SENSOR AS POP MICROWAVE PCB

This application is a 35 U.S.C. §371 National Stage Application of PCT/EP2011/063070, filed on Jul. 29, 2011, which claims the benefit of priority to Serial No. DE 10 2010 041 129.9, filed on Sep. 21, 2010 in Germany, the disclosures of which are incorporated herein by reference in their entirety.

BACKGROUND

The present disclosure relates to a method for producing a component with at least a first microstructured or nanostructured device and to such a component.

In device technology, Package-on-Package (PoP) technology is increasingly being used for a high integration density of multiple functions. This offers the great advantage over the System-in-Package (SiP) approach that there can be a much more flexible response to changes in the design of individual components.

A package variant is that of eWLB (Embedded Wafer Level BGA Technology), which is described for example in DE 102 006 001 429 A1.

Semiconductor components that are known as so-called flip-chip components or as WLP components (Wafer Level Package) are attached with their flip-chip contacts as bare semiconductor chips to higher-level printed circuit boards or are coated with a thin protective polymer layer before being applied to the higher-level printed circuit board.

When there are many different chips, this has the result in the case of the eWLB method that a carrier is loaded with the chips arranged next to one another. This arrangement causes a high lateral space requirement. Therefore, here there is the necessity for at least some of the chips to be stacked one on top of the other and to be connected to one another by means of through contacts.

SUMMARY

A subject matter of the present disclosure is a method for producing a component, which comprises at least one microstructured or nanostructured device, comprising the steps of:
a) applying at least one microstructured or nanostructured device with at least one region intended for making contact to a carrier, wherein the device is applied to the carrier in such a way that at least one region of the device that is intended for making contact adjoins the carrier;
b) enveloping, in particular partially or completely enveloping, the device in an enveloping compound;
c) detaching the device/enveloping-compound composite, in particular from method step b), from the carrier;
d) applying a first layer comprising electrically conductive regions to the side of the device/enveloping-compound composite that previously adjoined the carrier;
e) introducing at least one passage through the enveloping compound; and
f) applying a conductor layer to the surface of the passage and at least to a portion of the first layer comprising electrically conductive regions in such a way that the conductor layer electrically contacts a region intended for making contact.

For the purposes of the present disclosure, a microstructured or nanostructured device may in particular be a device with internal structure dimensions in the range from ≥1 nm to ≤200 µm. The internal structure dimensions may be understood here as meaning the dimensions of structures within the device, such as for example struts, webs or conductor tracks. The microstructured or nanostructured device may comprise a region or an area that is intended for electrically contacting the device, for example with a further microstructured or nanostructured device. Such a region may also be referred to as an active area, terminal pad or (terminal) contact. These microstructured or nanostructured devices may comprise, inter alia, integrated circuits, sensor elements, passive devices, ceramic capacitors, resistors or actuators.

A "conductor layer" may be understood for the purposes of the present disclosure as meaning in particular a layer of an electrically conductive material. For example, the conductor layer may be formed from a metal, a metal mixture or an electrically conductive polymer or a sequence of layers. For example, the conductor layer may comprise at least one material that is selected from the group consisting of aluminum, copper, silver, gold, nickel, palladium, platinum, chromium, silicon, titanium, titanium nitride, electrically conductive polymers and mixtures and sequences of layers thereof, in particular copper, nickel, gold and/or palladium.

In the context of the method according to the disclosure, method step e) may be performed before, after or at the same time as method step c) or d).

The method according to the disclosure advantageously allows the production of components which are based on a Package-on-Package (PoP) technology in combination with wafer molding and a redistribution technology, for example thin-film technology and/or RCC (Resin-Coated-Copper) technology. The resulting components, also known as modules, have a miniaturized, low-cost package. Applying the conductor layer to the surface of the passage, for example by means of wet chemical processes, such as electrodeposition, advantageously allows a through contact to be formed. Equally, applying the conductor layer to the previously exposed region of the device that is intended for making contact allows the device to be advantageously electrically contacted. Moreover, when the conductor layer is applied, conductive regions within the layer comprising conductive regions may advantageously be electrically connected at the same time to the through contact and/or the device.

In the context of method step a), both regions of the device that are intended for making contact and other sub-regions of the device can equally make contact with one side of the carrier. The application of the device may be carried out by an automatic pick-and-place machine. In addition, the application of the device may be facilitated by heating the carrier and/or the devices.

The material of the carrier may for example be selected from the group consisting of ceramics, metals or high melting plastics. In this method, the carrier may be used as a basis for batch technologies.

The carrier may comprise an applied connecting layer for fixing applied microstructured or nanostructured devices on the carrier in a preferred arrangement. The connecting layer may for example be applied uniformly on one side of the carrier. The connecting layer used may remain stable without decomposing at temperatures of up to 200° C. This makes it possible that the connecting layer comprises an adhering and/or laminating film. As an alternative to this, the connecting layer may be spin-coated onto the carrier or be applied by spray coating.

Within method step b), the enveloping compound may cover the device and possibly the sub-regions of the carrier that adjoin the device. In particular, the enveloping of the device with the enveloping compound allows a composite comprising at least one device, for example two or more devices, and the enveloping compound to be obtained, referred to in the context of the present disclosure as the device/enveloping-compound composite. The device is preferably enveloped in the enveloping compound in such a way that the device is integrated in a layer of enveloping compound. The enveloping compound layer preferably has in this case a layer thickness which is equal to or greater than the overall height of the largest device. An enveloping compound of which the layer thickness is greater than the overall height of the largest device makes it possible to ensure that the device does not protrude out of the device/enveloping-compound composite. This in turn has the advantage that the device/enveloping-compound composite can be stacked better. In a further alternative, the device may be integrated in the enveloping compound in such a way that the side of the device that is facing away from the carrier is exposed after the enveloping.

In the context of the present disclosure, the "enveloping" may be performed by a method of encapsulation by molding, transfer molding, potting, injection molding and lamination, also covered by the terms sheet molding, compression molding and liquid molding, as well as combinations thereof. The enveloping may also include at least partial enveloping, wherein for example one side of the device is left free of the enveloping compound.

The enveloping compound may also be referred to as a potting compound, plastic package compound, molding compound component, sealing compound, transfer molding compound, encapsulating compound, molding compound and/or compression molding compound. The enveloping compound may comprise at least one component that is selected from the group consisting of epoxy resins, polyacrylates, polyoxymethylenes and/or silicones. In addition, the enveloping compound may comprise fillers. In this way, the material properties of the enveloping compound can be advantageously set. Preferably, the enveloping compound used has an electrical conductivity that is as low as possible, or is electrically insulating.

Furthermore, the enveloping compound may have in particular a low coefficient of thermal conductivity, for example of $\leq 2.0$ $Wm^{-1}K^{-1}$. Furthermore, the enveloping compound may have a low shrinkage during the hardening process. In particular, the enveloping compound may be homogeneous. Furthermore, the enveloping compound may have a similar coefficient of thermal expansion to the enveloped device, for example of silicon. In this case, similar may mean in particular that the coefficient of thermal expansion of the enveloping compound and of the device differ by less than or equal to a factor of ten. Similarly, the enveloping compound may in particular have a high modulus of elasticity and/or a high glass transition temperature, for example of $\geq 120°$ C.

Following the enveloping with the enveloping compound, the arrangement obtained may be heated. The arrangement obtained should be understood here as meaning for example the enveloped devices and the enveloping compound obtained from the previous method steps. For example, the arrangement may in this case cure completely before or after detachment from the carrier. In particular, the arrangement may be heated after detachment from the carrier. This step is also referred to as the Post-Mold-Cure (PMC) step. The PMC step may be used within the present disclosure to achieve curing and final crosslinking of the enveloping compound.

In the context of method step c), the device/enveloping-compound composite or the enveloping compound with the device is preferably detached from the carrier as a unit.

Method step d) may comprise both one method step and more than one method step. The layer comprising electrically conductive regions may for example comprise at least one electrically conductive ply and at least one electrically insulating ply. In particular, in method step d) the layer comprising electrically conductive regions may be applied in such a way that an electrically insulating ply is facing the composite and/or an electrically conductive ply is facing away from the composite. Apart from the electrically conductive ply and the electrically insulating ply, the layer comprising electrically conductive regions may comprise further plies. In this case, the material of one ply may be partially or completely embedded in the material of another ply. In particular, the layer comprising electrically conductive regions may have a structured, electrically conductive ply. For example, the electrically conductive ply may be structured in such a way that it comprises conductor tracks and possibly adjusting marks, in particular for the placement of devices. For example, the layer comprising electrically conductive regions may have two electrically insulating plies and one structured, electrically conductive ply arranged between them.

The electrically conductive ply of the layer comprising electrically conductive regions may in particular comprise at least one material that is selected from the group consisting of aluminum, copper, silver, gold, nickel, palladium, platinum, chromium, silicon, titanium, titanium nitride, electrically conductive polymers as well as mixtures, alloys and sequences of layers thereof, in particular copper, nickel, gold and/or palladium. Apart from good conductivity and structurability, these materials may have a high coefficient of thermal conductivity, which allows heat produced during operation to be dissipated well.

The layer comprising electrically conductive regions may in this case have an area that is smaller than or the same size as the side of the device/enveloping-compound composite that previously adjoined the carrier. In particular, the layer comprising electrically conductive regions and the side of the device/enveloping-compound composite that previously adjoined the carrier may be in contact with each other partially or over their full surface area, in particular over their full surface area. In this way, the devices can be stacked better. Moreover, it may be possible to dispense with cleanroom conditions.

For example, the layer comprising electrically conductive regions may be applied by means of thin-film technology, for example in two or more steps. For example, first an electrically insulating ply may be applied. This insulating ply may be both structured and flat. Subsequently, an electrically conductive ply may be applied to the electrically insulating ply. This conductive ply may likewise be structured or flat. The plies may for example be applied in a form in which they are structured by clearances. However, it is similarly possible to introduce clearances after application and to structure the plies in this way. When a further, for example electrically conducting or insulating, in particular electrically conducting, ply is applied, these clearances may in turn be filled with the material of the further ply, for example the electrically conducting or insulating material of the further ply. In particular, the first layer comprising electrically conductive regions may have at least one electrically conductive ply and at least one electrically insulating ply. For example, the first layer comprising electrically conductive regions may be applied to the device/enveloping-compound composite in such a way that an electrically insulating ply is facing the composite. In this case, in method step f) the application of a conductor layer may be carried out in such a way that the conductor layer electrically contacts a region of a device that is intended for making contact indirectly by way of the electrically conductive ply of the layer comprising electrically conductive regions.

As an alternative to this, a layer comprising electrically conductive regions may be applied in particular by RCC technology, for example in one method step. In this case, an electrically insulating ply may be facing the composite. The RCC layer may be subsequently structured by means of etching processes and/or laser processes, for example by introducing one or more clearances. In particular, in a method step between method steps d) and f), at least one clearance may be introduced into the layer comprising electrically conductive regions, in particular the RCC layer, in such a way that at least one region of the device that is intended for making contact is exposed. In this case, the conductor layer may be applied to the surface of the passage, a portion of the layer comprising electrically conductive regions and the previously exposed region of the device that is intended for making contact. In particular in the case of an RCC layer, in method step f) the application of the conductor layer may be carried out in such a way that the conductor layer electrically contacts a region intended for making contact directly.

In method step e), the introduction of the passage may be performed by means of a photolithographic process, mechanical drilling and/or a laser process. In this case, the clearance may pass through at least one electrically conductive ply and/or through at least one electrically insulating ply. In method step e), the passage is preferably created at a location or at locations at which the singulation is performed in a later method step. For example, the passage may be introduced through the enveloping compound and the layer comprising electrically conductive regions. In particular, the passage may be introduced in such a way that it extends from the side face of the composite to which the first layer comprising electrically conductive regions has been applied to the opposite side of the composite. Since the passages can form through contacts with the conductor layer applied in method step f), this has the advantage that the through contacts are severed during the singulation, for example halved or quartered, and a multiplicity of through contacts are produced. Thus, both the lateral extent (footprint) of the component and the production expenditure can be advantageously reduced. A further advantage of through contacts that are severed during the singulation may lie in the possibility of simple contacting of the component at this location and of optical, for example automated, quality control. In addition, the through contacts, which may also be referred to as TMVs (Through-Mold Vias), may have a higher aspect ratio than the blind vias known from the prior art.

The material of the conductor layer applied in method step f) preferably corresponds to the material of the electrically conductive ply of the layer comprising electrically conductive regions. As already explained, applying a conductor layer to the surface of the passage allows a through contact to be produced. In this case, a through contact may be formed on the one hand by the surface of the passage being provided with the conductor layer in such a way that the passage remains open right through and a sleeve-like conductor layer is formed in the passage. On the other hand, a through contact may be formed by the surface of the passage being provided with the conductor layer in such a way that it fills the passage completely. In the case of a sleeve-like configuration, the material consumption of conductor material can advantageously be reduced, and consequently the costs are lowered.

In the context of one embodiment of the method, in method step d) a second layer comprising electrically conductive regions is applied to the side of the device/enveloping-compound composite that is opposite from the side that previously adjoined the carrier. The procedure followed for this may be analogous to the explanations given in connection with the first layer comprising electrically conductive regions, to which reference is hereby explicitly made. Thus, the second layer comprising electrically conductive regions may also have at least one electrically conductive ply and at least one electrically insulating ply and/or be applied in such a way that an electrically insulating ply is facing the composite and/or an electrically conductive ply is facing away from the composite. In particular, in method step f) the conductor layer may be additionally applied at least to a portion of the second layer comprising electrically conductive regions. In this way, the component to be produced can be provided with an area by way of which electrical contacting of further components arranged on it can be performed.

In the context of a further embodiment of the method, the method further comprises the step g) of conductor track structuring by partial removal of the conductor layer and possibly of electrically conductive plies of the first and/or second layer comprising electrically conductive regions. In this case, the conductor track structuring may be performed for example by a photolithographic process. In this case, the electrically conductive ply of the layer comprising electrically conductive regions may be partially removed (laterally) in such a way that only the electrically insulating ply remains in one or more portions of the layer comprising electrically conductive regions. The conductor layer is preferably not removed in the region of previous passages.

In a further embodiment of the method, the method comprises the step h) of applying an insulating layer to and/or between the conductor-track-structured layer from method step g). The insulating layer may in this case be already pre-structured or be structured after the application. For example, an insulating layer may be at least partially or completely applied to the previously removed region. In particular, the insulating layer may contact at least also a sub-region of the not removed conductor layer and/or of the electrically conductive and/or electrically insulating ply of the layer comprising electrically conductive regions. In this case, the side of the insulating layer that is facing away from the composite may protrude beyond the side of the conductor layer that is facing away from the composite. For example, the side of the insulating layer that is facing away from the composite may protrude beyond the side of the conductor layer that is facing away from the composite by $\geq 5$ µm to $\leq 500$ µm. An insulating layer protruding beyond the conductor layer can be advantageously used to ensure insulation of the component with respect to another component stacked on it or under it.

The material of the insulating layer may in particular comprise at least one plastic that is selected from the group consisting of polyimide, benzocyclobutene (BCB), photosensitive epoxy resins, for example WPR, polypropylene, polyethylene, polyethylene terephthalate, polyurethane, silicone and combinations thereof.

The insulating layer may for example be structured in such a way that it has portions with clearances alongside the previous passage and exposes the conductor layer applied on the layer comprising electrically conductive regions. Contact elements (bumps) may be advantageously positioned in the portions with clearances. With the aid of these contact elements, the component can be advantageously electrically contacted.

In the context of a further embodiment, the method further comprises the step i) of singulating the resulting arrangement in such a way that at least one separating plane runs through at least one passage. In particular, the singulation in step i) may be performed in such a way that at least one separating plane runs through at least one passage and parallel to the direction in which this passage passes through. In this case, the singulation may be carried out by means of a sawing device or a laser. Singulation may be understood for example as meaning that, after this step, individual units that are contactable or can be contacted with other components are obtained. For example, multiple microstructured or nanostructured devices with a region intended for making contact may be applied to the carrier, wherein the devices are applied to the carrier in such a way that at least one region of the devices that is intended for making contact respectively adjoins the carrier, the devices being enveloped in an enveloping compound. In one configuration, the devices may be enveloped in the enveloping compound in each case individually or in component groups. In this case, at least one part of the carrier between the individual enveloped devices or device groups may not be covered by the enveloping compound. In another configuration, all the devices may be equally enveloped in the enveloping compound. After that, the device/enveloping-compound composites or the device/enveloping-compound composite may be detached from the carrier and a first layer comprising electrically conductive regions may be applied to the side of the device/enveloping-compound composites or the device/enveloping-compound composite that previously adjoined the carrier. For example, the first layer comprising electrically conductive regions may have at least one electrically conductive ply and at least one electrically insulating ply and be applied for example in such a way that an electrically insulating ply is facing the composite. After that, at least one clearance may be introduced into the first layer comprising electrically conductive regions in such a way that at least one region of the device that is intended for making contact is exposed. This may be followed by introducing at least one passage through the enveloping compound and applying a conductor layer to the surface of the passage, the surface of the layer comprising electrically conductive regions and the previously exposed region of the device that is intended for making contact. For example, in the case of multiple passages being present, singulation may be carried out such that a fraction, for example half, of the passage is respectively present on the singulated component after the singulation. Consequently, the divided, for example halved, passage can be used as a through contact for multiple components. This advantageously makes it possible to produce multiple components simultaneously as multi-component panels. Thus, the process chain can be advantageously shortened and the material consumption reduced.

It is possible to apply further microstructured or nanostructured devices to the enveloping compound before the singulation i). The further microstructured or nanostructured devices may for example be electrically contacted with the arrangement produced in method steps a) to h) by wire contacts (wire bonds). For example, further devices applied on the enveloping compound may be electrically connected to the component, in particular to a conductor layer of the component, by wire contacts. This may be followed by further enveloping with an enveloping compound, so that these further microstructured or nanostructured devices and their wire contacts are enveloped by the enveloping compound. In a further embodiment, it is possible to stack further devices onto this composite and to repeat the previously mentioned method steps. Subsequently, the component systems may be singulated.

In particular, the method according to the disclosure is suitable for producing a component system comprising two or more components, for example according to the disclosure. For example, a first component may thereby be stacked on a further component. In this case, the second component may for example be arranged or applied on the upper side of the first component, wherein the second component electrically contacts the conductor layer of the first component by means of contact elements (bumps). In this case, the contact elements of the second component may be arranged both on the portion of the conductor layer in the region of the through contact (previous passage) and on a portion of the conductor layer in the region of the layer comprising electrically conductive regions. Thus, the second component may advantageously be electrically contacted by way of the through contact through the first component that is formed by the passage and the conductor layer. The second component may in this case likewise be produced by the method according to the disclosure.

The distance between the first component and the second component may for example have a value in a range from $\geq 10$ µm to $\leq 250$ µm, in particular a value in a range from $\geq 20$ µm to $\leq 100$ µm. Component packages with a small overall height can be advantageously realized in this way.

With regard to further advantages and features, reference is hereby explicitly made to the features and advantages explained in the context of the component according to the disclosure and the drawings.

A further subject matter of the disclosure relates to a component, in particular an electromechanical component, comprising a device/enveloping-compound composite made up of an enveloping compound layer and at least one microstructured or nanostructured device, wherein a region of the device that is intended for making contact forms a portion of a first side face of the composite. In particular, in this case the device may be integrated in the enveloping compound layer in such a way that at least one region of the device that is intended for making contact forms a portion of a first side face of the composite.

Furthermore, the component comprises a first layer comprising electrically conductive regions, wherein the layer comprising electrically conductive regions is connected to the first side face of the composite. In this case, the layer comprising electrically conductive regions may for example comprise at least one electrically conductive ply and at least one electrically insulating ply. In this case, the layer comprising electrically conductive regions may be connected to the first side face of the composite by way of an electrically insulating ply.

Furthermore, the component comprises a conductor layer, which covers at least a portion of the first layer comprising electrically conductive regions and a portion of a second side face of the composite that adjoins the first side face, or the surface of a clearance in the enveloping compound layer that extends from the first side face to a third side face of the composite that is opposite from the first side face, wherein the conductor layer electrically contacts the region of the device that is intended for making contact directly or indirectly by way of the layer comprising electrically conductive regions, in particular by way of the electrically conductive ply.

The first layer comprising electrically conductive regions may for example comprise at least one electrically conductive ply and at least one electrically insulating ply. In this case, the layer comprising electrically conductive regions may be connected to the first side face of the composite by way of an electrically insulating ply. In this case, the layer comprising electrically conductive regions may also be provided with clearances in the portion of the region of the device that is intended for making contact. The clearance may in this case pass through the electrically conductive ply and/or through the electrically insulating ply.

The conductor layer may in particular cover at least the region of the device that is intended for making contact, a portion of the first layer comprising electrically conductive regions that adjoins the region of the device that is intended for making contact and a second side face of the composite that adjoins this portion of the layer comprising electrically conductive regions, or the surface of a clearance in the enveloping compound layer that adjoins this portion of the layer comprising electrically conductive regions and extends from the first side face of the composite to a third side face of the composite that is opposite from the first side face. The fact that the conductor layer covers the surface of the clearance in the enveloping compound layer advantageously allows a through contact to be formed.

At the same time, the fact that the conductor layer covers the region of the device that is intended for making contact allows the device to be advantageously electrically contacted. Moreover, the fact that the conductor layer partially covers the first layer comprising electrically conductive regions advantageously allows at the same time conductive regions within the layer comprising conductive regions to be electrically connected to the through contact and/or the device. Thus, the stacking and contacting of multiple components, and with it the production of miniaturized device packages, can be advantageously achieved.

As illustrated in FIG. 5b, the component may in particular comprise devices stacked one on top of the other. For example, an arrangement analogous to FIG. 5b of two components stacked one on top of the other can be produced by first a first device being enveloped by an enveloping compound, then the composite being provided with the conductor layer according to the disclosure, after that a second device being applied to the enveloping compound or a carrier layer and contacted with the conductor layer and subsequently the second device being enveloped in an enveloping compound. The contacting with the conductor layer may in this case be performed for example by wire bonds or terminal elements.

In the context of one embodiment, the component comprises a second layer comprising electrically conductive regions, wherein the second layer comprising electrically conductive regions is connected to the third side face of the composite, the conductor layer also covering a portion of the second layer comprising the electrically conductive regions that adjoins the second side face of the composite or that adjoins the clearance in the enveloping compound layer. In this case, the second layer comprising electrically conductive regions may, by analogy with the first layer, comprise at least one electrically conductive ply and at least one electrically insulating ply. The conductor layer may possibly cover the electrically insulating ply of the second layer comprising electrically conductive regions. For this purpose, the electrically conductive ply of the second layer comprising electrically conductive regions may for example be partially provided with clearances. As a result, further structuring may be advantageously performed on the second side face of the composite.

In the context of a further embodiment, the conductor layer of the component according to the disclosure has in the region of the first and/or second layer comprising electrically conductive regions at least one conductor-track-structuring clearance. By suitable arrangement of the clearances, conductor tracks can be advantageously created.

In the context of a further embodiment of the component according to the disclosure, the first and/or second layer comprising electrically conductive regions has at least one conductor-track-structuring clearance. In particular, the electrically conductive ply of the first and/or second electrically conductive layer may in this case have a conductor-track-structuring clearance. These clearances may be advantageously used for the conductor track structuring.

In the context of a further embodiment, the component comprises an insulating layer. The insulating layer preferably fills the conductor-track-structuring clearances in the conductor layer and/or the first and/or second layer comprising electrically conductive regions. The insulating layer may in this case cover the portions of the conductor layer that adjoin the conductor-track-structuring clearances.

The insulating layer preferably protrudes beyond the conductor layer, for example by ≥5 μm to ≤500 μm. In this way, the insulating layer may additionally serve for insulating two components stacked one on top of the other.

The insulating layer preferably also has in the region of the conductor layer at least one clearance for receiving a contact element and/or for forming a soldering location. Thus, the insulating layer may additionally serve as a solder resist. For example, the clearance may be formed for receiving a contact element and/or for forming a soldering location alongside the clearance in the enveloping compound layer.

In particular, the component may have a contact element, which extends from outside through a clearance in the insulating layer and is connected to the conductor layer, in particular electrically and mechanically. A contact element may in this case be understood for example as meaning a contact, a terminal pad, a solder bump, a solder ball or a soldering location.

In the context of a further embodiment, the conductor layer is formed in a sleeve-like manner in the region of the clearance in the enveloping compound layer. A sleeve-like form advantageously leads to reduced material consumption, which leads to a reduction in the cost of the component.

In the context of a further embodiment, the clearance in the enveloping compound layer is filled with the material of the conductor layer.

With regard to further advantages and features, reference is hereby explicitly made to the features and advantages explained in the context of the method according to the disclosure and the drawings.

A further subject matter of the disclosure relates to a component system, wherein the component system comprises at least a first component according to the disclosure or a first component produced by a method according to the disclosure and at least a second component with at least one region intended for making contact, in particular wherein the region of the second component that is intended for making contact electrically contacts the conductor layer of the first component (directly or indirectly). For example, the region of the second component that is intended for making contact may electrically contact the conductor layer of the first component indirectly by way of a contact element. In particular, in the case of an arrangement of two components, the second component may not have a through contact. If the second component has a through contact, a further, third component on the second component may be contacted by way of this through contact.

In the context of a further embodiment of the component system, the region of the second component that is intended for making contact electrically contacts the conductor layer of the first component on the third and/or second side face of the composite. This makes simple contacting possible. In addition, this makes it possible to optimize the lateral and/or vertical space requirement in the Package-on-Package composite.

For example, the region of the second component that is intended for making contact may electrically contact the conductor layer of the first component in the region of the clearance in the enveloping compound layer or of the through contact. For example, the region of the second component that is intended for making contact may electrically contact the conductor layer of the first component in the region of the clearance in the enveloping compound layer or of the through contact by way of a contact element. In particular, the contact element may in this case be positioned over the clearance in the enveloping compound layer or the through contact. However, it is similarly possible that the contact element is in this case positioned on a region of the conductor layer of the first component that is alongside and/or at a distance from the clearance in the enveloping compound layer or the through contact.

In particular, the component system may comprise at least two components according to the disclosure that are stacked one on top of the other and/or arranged next to one another. In this case, the lateral dimensions of stacked components may vary. Contacting of the components may be performed from one component to the other component by way of a through contact. Contacting of the devices located in the components may advantageously be performed through the regions intended for making contact, which are connected to the through contact, in particular electrically, by way of the layer comprising electrically conductive regions. This contacting arrangement advantageously allows different devices from the various components to be contacted with one another.

For example, the component or the component system may be a sensor or a multifunctional sensor module that is selected from the group consisting of pressure sensors, acceleration sensor, temperature sensor, rate of rotation sensor, mass flow sensor, magnetic sensor, gas sensor, Hall sensor, moisture sensor and combinations thereof.

BRIEF DESCRIPTION OF THE DRAWINGS

Further advantages and advantageous configurations of the subjects according to the disclosure are illustrated by the drawings and explained in the description which follows. It should be noted here that the drawings only have a descriptive character and are not intended to restrict the disclosure in any form. In the drawings.

DETAILED DESCRIPTION

FIGS. 1a to 1e show an embodiment of the method according to the disclosure.

Figure 1A:
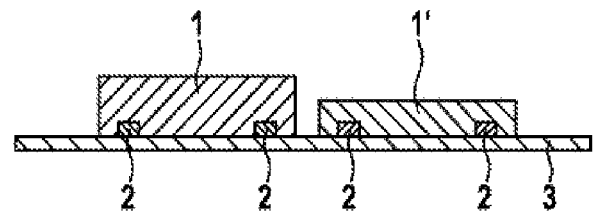
FIGS. 1a-e show schematic cross sections to illustrate a variant of the method according to the disclosure.

FIGS. 1a shows that a first 1 and a second 1' microstructured or nanostructured device has been applied to a carrier 3 in such a way that two regions 2 intended for making contact respectively adjoin the carrier 3. In this embodiment, the microstructured or nanostructured devices 1, 1' are arranged next to one another and do not contact one another directly.

Figure 1B:
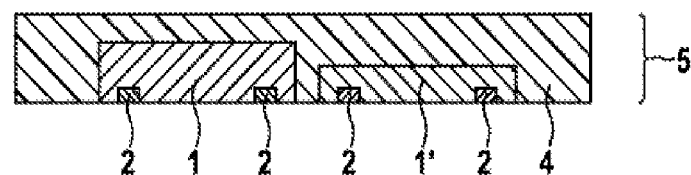

FIG. 1b illustrates that the devices 1, 1' have been enveloped in an enveloping compound 4 to form a device/enveloping-compound composite 5 and detached from the carrier (not represented). FIG. 1b shows that the lower areas of the microstructured or nanostructured devices 1, 1' in this case lie in one plane with the underside of the composite 5.

Figure 1C:
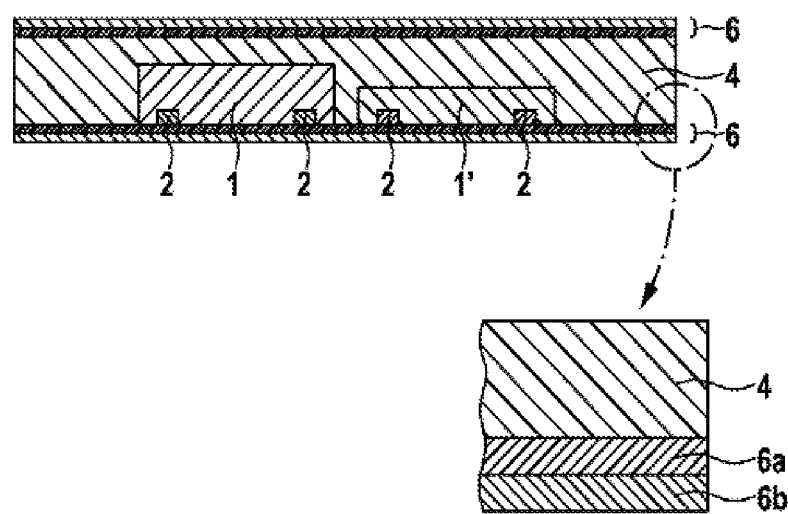

FIG. 1c shows that a layer 6 comprising electrically conductive regions has been applied both on the underside and on the upper side of the composite 5. In this embodiment, the layer comprises two plies 6a and 6b. The ply 6a is in this case electrically insulating and contacts the composite 5. The ply 6b is electrically conducting and is located on the side of the layer 6 comprising electrically conductive regions that is facing away from the composite 5. For example, the electrically conducting ply 6b may be formed from a metal.

Figure 1D:
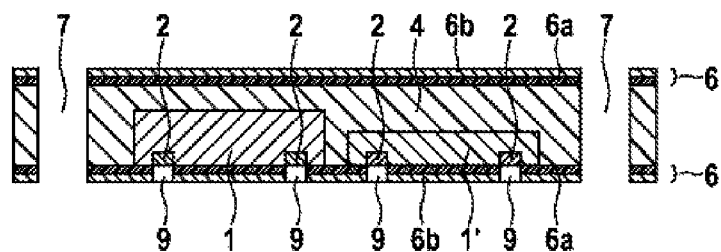

Figure 1d illustrates that two passages 7 have been introduced through the enveloping compound 4 and through the layer 6 comprising electrically conductive regions. The passages 7 in this case extend from the first side face of the composite 5, the underside, to the third side face of the composite 5, the upper side. The passages 7 are also referred to in the context of the present disclosure as clearances 7 in the enveloping compound layer.

FIG. 1d illustrates furthermore that four clearances have been introduced into the first layer 6 comprising electrically conductive regions in such a way that the regions 2 of the device 1 that are intended for making contact have been exposed. The clearances 9 consequently have the effect of creating access to the regions 2 of the devices 1, 1' that are intended for making contact.

Figure 1E:
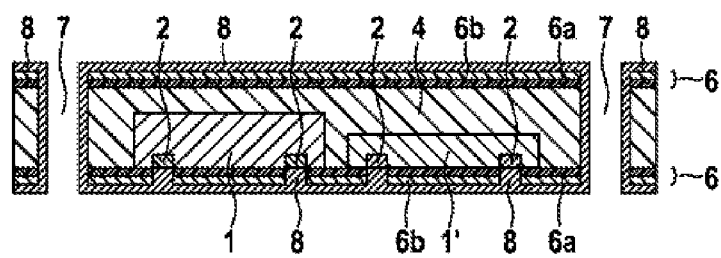

FIG. 1e shows that a conductor layer 8 has been applied to the surface of the passage 7, the surface of the layer 6 comprising the electrically conductive regions and the previously exposed region 2 of the device 1 that is intended for making contact. In this case, sleeve-like through contacts have been formed in the region of the clearances 7 in the enveloping compound layer.

Figure 2A:
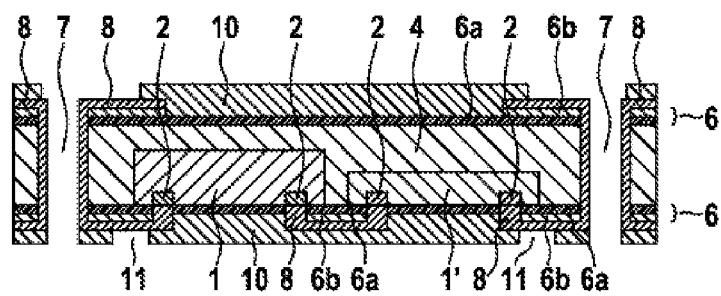
FIGS. 2a, 2b show schematic cross sections to illustrate a further variant of the method according to the disclosure.

FIG. 2a shows that, after part of the conductor layer 8 and part of the electrically conductive ply 6b have been removed to form conductor-track-structuring clearances, an insulating layer 10 has been applied. In this case, the insulating layer 10 fills the conductor-track-structuring clearances in the conductor layer 8 and the first and second layer 6 comprising electrically conductive regions. Likewise, the insulating layer 10 covers the portions of the conductor layer 8 that adjoin the conductor-track-structuring clearances. Moreover, the insulating layer protrudes beyond the conductor layer 8. In this example, the insulating layer 10 and the electrically insulating ply 6a of the layer 6 comprising electrically conductive regions are formed from the same material. Furthermore, in this example the conductor layer 8 and the electrically conductive ply 6b of the layer 6 comprising electrically conductive regions are formed from the same material. Furthermore, FIG. 2a shows that the insulating layer 10 has in the region of the conductor layer 8 two clearances 11 for receiving a contact element or for forming soldering locations.

Figure 2B:
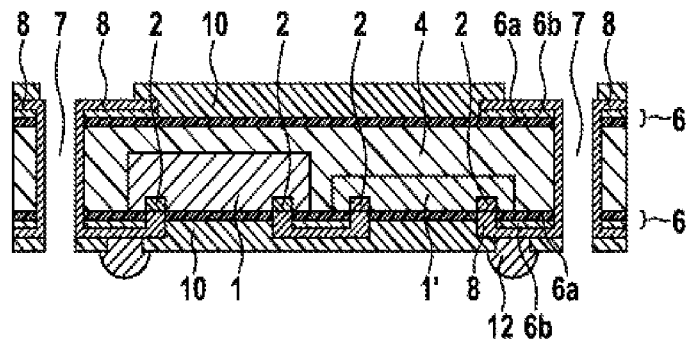

FIG. 2b shows a contact element 12, which extends from outside through the clearances 11 in the insulating layer 10 and is electrically and mechanically connected to the conductor layer 8.

Figure 3:
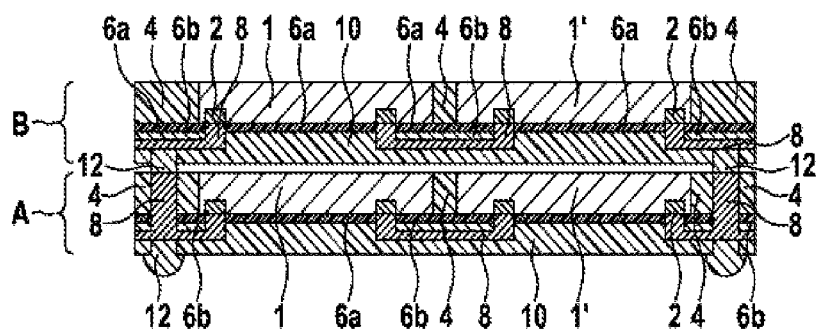
FIG. 3 shows a schematic cross section through an embodiment of a component system according to the disclosure.

FIG. 3 shows a schematic cross section through an embodiment of a component system according to the disclosure comprising a first component A and a second component B, wherein the second component B electrically contacts the first component A by way of a contact element 12.

In this embodiment, the first component A comprises a completely filled clearance 7 in the enveloping compound layer (through contact), wherein there is no layer 6 comprising electrically conductive regions, conductor layer 8 and insulating layer 10 located on the third side face of the component A.

The second component B likewise comprises two microstructured or nanostructured devices 1, 1' enveloped in an enveloping compound 4 as well as a layer 6a, 6b comprising electrically conductive regions located on the underside of this component B, a conductor layer 8, an insulating layer 10 and contact elements 12, which contact the component A. These contact elements 12 are positioned on the third side face of the component A in particular by way of in each case a passage 7 (through contact) of the first component A that is filled with a conductor layer 8.

Figure 4:
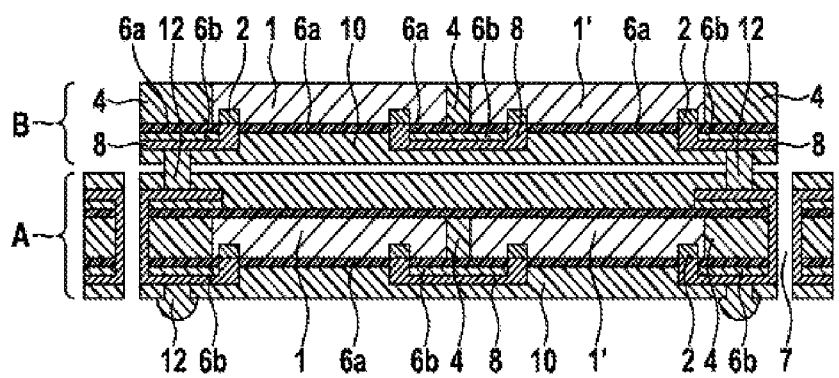
FIG. 4 shows a schematic cross section through a further embodiment of a component system according to the disclosure.

The embodiment of a component system according to the disclosure that is shown in FIG. 4 differs substantially from the embodiment shown in FIG. 3 in that the third side face of the component A has a conductor-track-structured layer with an insulating layer 10 and the clearance 7 in the enveloping compound layer is only provided with the conductor layer 8 on the surface and is not filled with the conductor layer 8. The component B contacts by way of its contact element 12 the conductor layer 8 of the component A on the third side face of the component A.

Figure 5A:
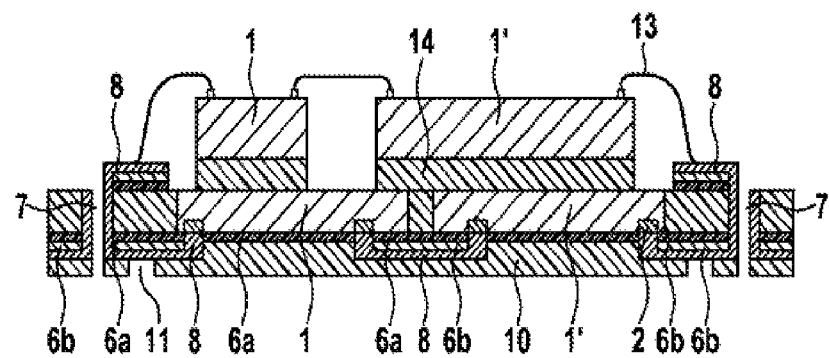
FIGS. 5a, 5b show schematic cross sections to illustrate a further variant of the method according to the disclosure.

FIG. 5a shows a schematic cross section to illustrate a further variant of the method according to the disclosure. FIG. 5a illustrates that further microstructured or nanostructured devices 1, 1' have been applied to a component produced according to the disclosure and have been electrically connected to the conductor layer 8 of the component by way of wire connections 13. In this case, the further microstructured or nanostructured devices 1, 1' are arranged on a carrier layer 14.

Figure 5B:
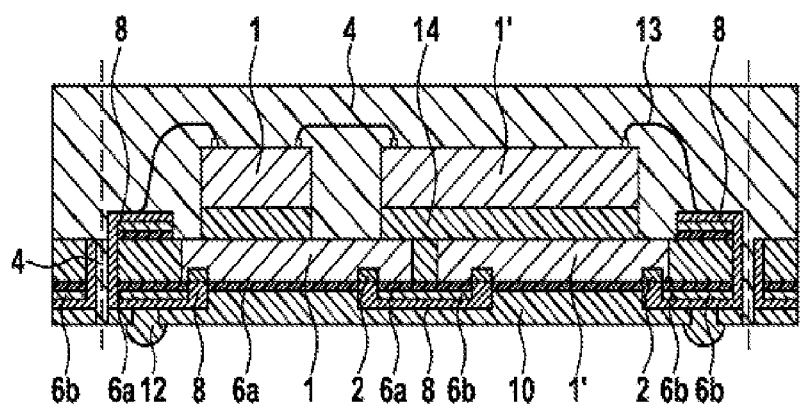

FIG. 5b illustrates that subsequently an enveloping compound 4 has again been applied, in order to envelop the further devices 1, 1' and form the device/enveloping-compound composite 5. Similarly, FIG. 5b shows the added contact elements 12. The dashed lines show the separating lines for a subsequent singulation.

Figure 6:
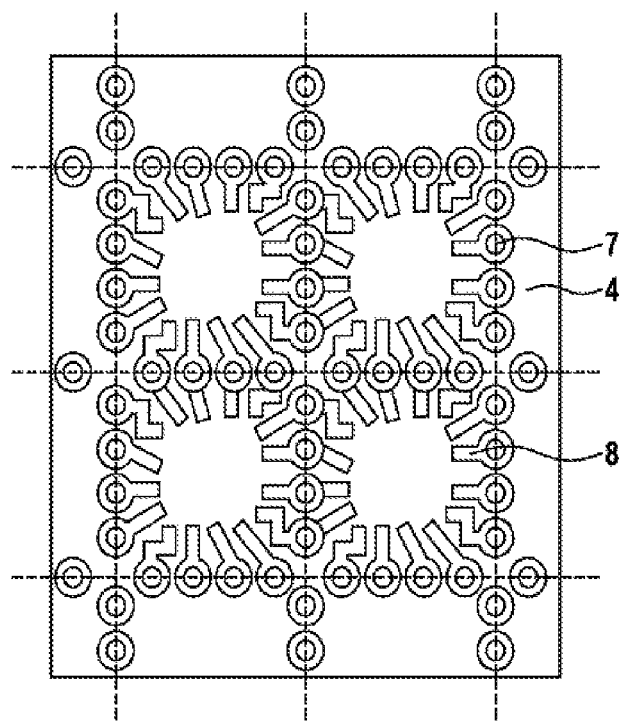
FIG. 6 shows a schematic plan view to illustrate a further variant of the method according to the disclosure.

FIG. 6 shows a schematic plan view to illustrate a further variant of the method according to the disclosure. The dashed lines show the separating lines in the singulation. The enveloping compound 4 and the through contacts 7 provided with a conductor layer 8 on their surface can be seen.

The invention claimed is:

1. A method for producing a component including at least one microstructured or nanostructured device, the method comprising:
    applying at least one microstructured or nanostructured device to a carrier in such a way that at least one region of the device that is configured to make contact adjoins the carrier;
    enveloping the device in an enveloping compound;
    detaching the device/enveloping-compound composite from the carrier;
    applying a first layer including electrically conductive regions to the entire side of the device/enveloping-compound composite that previously adjoined the carrier, wherein the first layer includes at least one electrically conductive ply and at least one electrically insulating ply;
    introducing at least one passage through the enveloping compound;
    applying a second layer including electrically conductive regions to the side of the device/enveloping-compound composite that is opposite from the side that previously adjoined the carrier; and
    applying a conductor layer to the surface of the passage and at least to a portion of the first layer in such a way that the conductor layer electrically contacts said at least one region and
    further applying the conductive layer such that the conductor layer covers a portion of the second layer.

2. The method as claimed in claim 1, further comprising conductor track structuring by partial removal of one or more of the conductor layer and electrically conductive plies of one or more of the first layer and/the second layer.

3. The method as claimed in claim 2, further comprising applying an insulating layer on and/or between the conductor-track-structured layer.

4. The method as claimed in claim 1, further comprising singulating the component in such a way that at least one separating plane runs through at least one passage formed in the component.

5. A component, comprising:
    a device/enveloping-compound composite including:
        an enveloping compound layer, and
        at least one microstructured or nanostructured device, the device having at least one region that is configured to make contact and that forms a portion of a first side face of the composite;
    a first layer including electrically conductive regions, the first layer being connected to the first side face of the composite in which said first layer includes at least one electrically conductive ply and at least one electrically insulating ply;
    a conductor layer covering at least a portion of the first layer and a portion of a second side face of the composite that adjoins the first side face or the surface of a clearance formed in the enveloping compound layer that extends from the first side face to a third side face of the composite that is opposite from the first side face; and
    a second layer including electrically conductive regions, the second layer being connected to the third side face of the composite,
    wherein the conductor layer covers a portion of the second layer that adjoins the second side face of the composite or that adjoins the clearance in the enveloping compound layer,
    wherein the conductor layer electrically contacts the region of the device that is configured to make contact directly or indirectly by way of the first layer.

6. The component as claimed in claim 5, wherein the conductor layer layer, has at least one conductor-track-structuring clearance in the region of one or more of the first layer and the second layer.

7. The component as claimed in claim 5, further comprising an insulating layer.

8. The component as claimed in claim 7, wherein the insulating layer one or more of (i) fills a conductor-track-structuring clearance in one or more of the conductor layer and/one or more of the first layer and a second layer (ii) covers the portions of the conductor layer that adjoin the conductor-track-structuring clearance, (iii) protrudes beyond the conductor layer, and/(iv) in the region of the conductor layer, forms at least one clearance configured to one or more of receive a contact element and/ form a soldering location.

9. The component as claimed in claim 8, further comprising at least one contact element, which extends from outside through a clearance in the insulating layer and is connected to the conductor layer.

10. The component as claimed claim 5, wherein:
    the conductor layer is formed in a sleeve-like manner in the region of the clearance in the enveloping compound layer, or
    the clearance in the enveloping compound layer is filled with the material of the conductor layer.

11. A component system, comprising:
    at least a first component including;
        a device/enveloping-compound composite including;

an enveloping compound layer, at least one microstructured or nanostructured device, the device having at least one region that is configured to make contact and that forms a portion of a first side face of the composite, a first layer including electrically conductive regions, the first layer being connected to the first side face of the composite, said first layer including at least one conducting ply and at least one insulating ply, and a conductor layer covering at least a portion of the first layer and a portion of a second side face of the composite that adjoins the first side face or the surface of a clearance formed in the enveloping compound layer that extends from the first side face to a third side face of the composite that is opposite from the first side face; and a second layer including electrically conductive regions, the second layer being connected to the third side face of the composite, wherein the conductor layer covers a portion of the second layer that adjoins the second side face of the composite or that adjoins the clearance in the enveloping compound layer, wherein the conductor layer electrically contacts the region of the device that is configured to make contact directly or indirectly by way of the first layer; and at least a second component with at least one region configured to make contact, wherein the region of the second component that is configured to make contact electrically contacts the conductor layer of the first component.

12. The component system as claimed in claim 11, wherein the contact element said region configured to make contact of the second component contacts the conductor layer of the first component on one or more of the third side face and/the second side face.

13. The component as claimed in claim 5, wherein the component is an electromechanical component.

14. The component as claimed in claim 5, wherein one or more of the first layer and the second layer has at least one conductor-track-structuring clearance.

15. The component as claimed in claim 14, wherein the electrically conductive ply of the one or more of the first layer and the second layer has the at least one conductor-track structuring clearance.

16. The component as claimed in claim 9, wherein the at least one contact element is electrically and mechanically connected to the conductor layer.

17. The component as claimed in claim 5, wherein the enveloping compound has a coefficient of thermal expansion that differs from the coefficient of thermal expansion of the enveloped microstructured or nanostructured device by less than or equal to a factor of ten.

18. The method as claimed in claim 3, wherein the insulating layer protrudes beyond the conductor layer.

* * * * *